United States Patent [19]

Cheriff et al.

[11] Patent Number: 5,008,656
[45] Date of Patent: Apr. 16, 1991

[54] FLEXIBLE CABLE ASSEMBLY

[75] Inventors: Frank J. Cheriff, Holliston; Joseph J. Kirk; Arnold M. Pulver, both of Sudbury; Walter N. Cox, Westboro, all of Mass.

[73] Assignee: Raytheon Company, Lexington, Mass.

[21] Appl. No.: 483,345

[22] Filed: Feb. 20, 1990

Related U.S. Application Data

[63] Continuation of Ser. No. 325,062, Mar. 14, 1989, abandoned, which is a continuation of Ser. No. 173,002, Mar. 30, 1988, abandoned, which is a continuation of Ser. No. 97,381, Sep. 16, 1987, abandoned, which is a continuation of Ser. No. 684,415, Dec. 20, 1984, abandoned.

[51] Int. Cl.$^5$ ............................................. G09G 3/00
[52] U.S. Cl. ..................................... 340/718; 340/719; 361/386; 361/388
[58] Field of Search ............... 340/718, 719, 815.2; 361/398, 400, 403, 408, 413, 417, 386, 388; 174/68.5, 117 R, 117 F, 117 PC, 117 A, 120 R, 252; 439/485

[56] References Cited

U.S. PATENT DOCUMENTS

| 3,749,959 | 7/1973 | Schmersal et al. | 174/117 PC |
|---|---|---|---|
| 4,015,422 | 4/1977 | Van Haaften | 340/815.2 |
| 4,042,861 | 8/1977 | Yasuda et al. | 340/815.2 |
| 4,468,659 | 8/1984 | Ohba et al. | 340/719 |
| 4,480,288 | 10/1984 | Gasdik et al. | 361/398 |
| 4,485,376 | 11/1984 | Noble | 340/718 |
| 4,489,365 | 12/1984 | Daberkoe | 174/68.5 |
| 4,538,143 | 8/1985 | Ito | 340/718 |
| 4,549,174 | 10/1985 | Funada et al. | 340/718 |
| 4,649,381 | 3/1987 | Masuda et al. | 340/718 |
| 4,689,110 | 8/1987 | Leibowitz | 361/388 |
| 4,827,377 | 5/1989 | Butt | 361/388 |

FOREIGN PATENT DOCUMENTS

| 1090003 | 11/1980 | Canada . |
| 0030167 | 10/1980 | European Pat. Off. . |
| 1476404 | 6/1977 | Japan . |
| 1476404 | 6/1977 | United Kingdom . |
| 2047474 | 11/1980 | United Kingdom . |
| 2129223 | 5/1984 | United Kingdom . |

Primary Examiner—Jeffery A. Brier
Attorney, Agent, or Firm—Walter F. Dawson; Richard M. Sharkansky

[57] ABSTRACT

A flexible cable assembly having a leadless chip carrier attached to a flexible cable for providing drive signals to a matrix display element. Pins at one end of the flexible cable assembly plug into a printed wiring board and exposed metallic pads at the other end press against mating pads on the edge of the display element; the pressed together pads are held in place with a U-shaped clamp. Connection points on the leadless chip carrier are soldered to mating soldering pads on the flexible cable. A heat sink/backer is attached to the opposite side of the flexible cable under the leadless chip carrier.

6 Claims, 6 Drawing Sheets

FLEXIBLE CABLE ASSEMBLY

This application is a continuation of application Ser. No. 325,062, filed Mar. 14, 1989, now abandoned, which is a continuation of Ser. No. 173,002, filed Mar. 30, 1988, now abandoned, which is a continuation of Ser. No. 097,381, filed Sept. 16, 1987, now abandoned, which is a continuation of Ser. No. 684,415, filed Dec. 20, 1984, now abandoned.

BACKGROUND OF THE INVENTION

This invention relates generally to printed circuits and in particular to a flexible ribbon cable for interconnecting portions of a display system such as between a matrix display element and it drive electronics.

Prior packaging techniques for electronic equipment have typically involved mounting active and passive electronic components on a single layer or multilayer printed wiring board (PWB). A plurality of such printed wiring boards are interconnected by plugging the plurality of boards into a "mother" interconnect panel. In some applications where space is at a premium the interconnect panel is replaced by straight runs of flexible ribbon cable such as in a flat panel matrix display system for interconnecting the contacts on the edge of a display element to the contacts on the edge of a display drive electronics printed wiring board. Typically there may be between 500 to 6000 electrical connections between the display element and the drive electronics resulting in considerable space required for the drive electronics, significant assembly costs and limits on the degree of maintainability in the field. If connections between the drive electronics and the display element need to be undone in the field for testing or replacement of only a single inexpensive faulty device, the display assembly must be returned to a service center for reassembly. As a result, the display element and drive electronics are spared in the field as a single line replaceable unit (LRU), which is expensive. If the display system parts are designed to be readily separable, then repair of the drive electronics is feasible in the field requiring only the sparing of relatively inexpensive parts or devices.

The high voltage driver circuits have accounted for most of the drive electronics volume requirements in a matrix display system. The packaging of high voltage driver circuits in a leadless chip carrier (LCC) configuration can achieve significant volume reductions in such a display system; however, an assembly problem arises if a surface mounted LCC and conventional thru-board integrated circuit (IC) devices such as dual in-line packages (DIPS) are mounted on the same printed wiring board because two incompatible assembly techniques are required. This approach by itself does not reduce the large number of interconnections required between the display drive electronics and the display element.

SUMMARY OF THE INVENTION

In accordance with the present invention a flexible cable assembly is provided having a flexible insulating substrate with a plurality of conductors formed thereon. A prearranged group of solder pads are disposed on the substrate and a plurality of the solder pads are electrically connected to the conductors; a circuit package is attached to the solder pads. Pins inserted into one end of the flexible cable assembly provide the means for connecting to a printed wiring board and exposed conductors with conductive plating on one side of a second end of the flexible cable assembly provide the means for clamping this second end to matching conductors. A heat sink/backer is laminated to the area under the circuit package and the substrate. A plurality of flexible cable assemblies interconnect a drive electronics module to a matrix display element in a display assembly. The circuit package comprises high voltage driver circuits mounted in a leadless chip carrier (LCC) resulting in a reduction in the volume required for the drive electronics. In addition, the circuit package attached to the flexible cable provides the means for reducing the number of connections required between the drive electronics and each flexible cable assembly. The flexible cable assembly provides the means for a more readily repairable display assembly in a field application environment.

In accordance with a further feature of the invention a method of making a flexible cable assembly is provided comprising the steps of providing a flexible cable having formed therein a plurality of strip conductors arranged in one or more layers with flexible insulating means attached to each side of the layers of conductors and having arranged thereon a group of solder pads on a portion of a first side in a region of a first end of the flexible cable, a portion of said solder pads being coupled to a first portion of the strip conductors and a noninsulated second portion of said strip conductors on a second side of a second end of the assembly being conductive-plated, soldering a circuit means to the arranged solder pads on the first side of the flexible cable, laminating a heat sink/backer on a portion of the second side of the flexible cable under the cable and the circuit means, and soldering terminal pin means on said first end of said flexible cable immediately adjacent to the circuit means, the pin means being coupled to a portion of the strip conductors and a portion of the solder pads.

BRIEF DESCRIPTION OF THE DRAWINGS

The above-mentioned aspects and other features of the invention are explained more fully in the following description taken in connection with the accompanying drawings, in which.

DESCRIPTION OF THE PREFERRED EMBODIMENT

Figure 1:
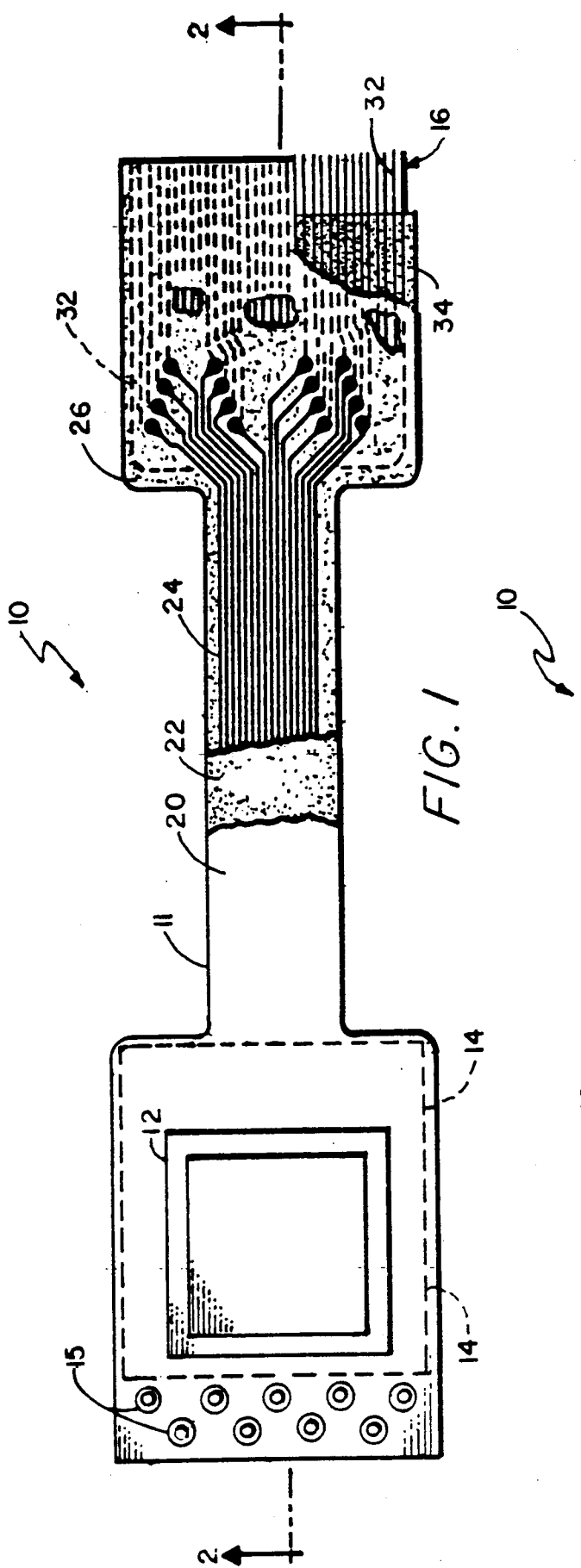
FIG. 1 is a top view of a flexible cable assembly according to the invention showing two layers of conductors.
Figure 2:
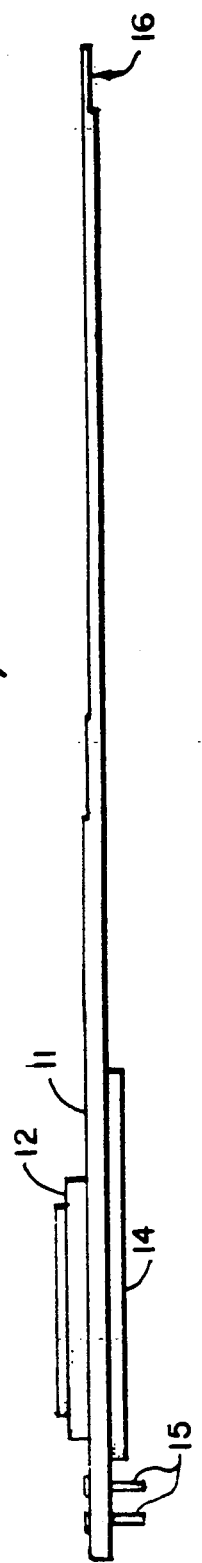
FIG. 2 is a side view of the flexible cable assembly showing a leadless chip carrier mounted on a first end of said cable assembly next to insertion pins and a heat sink/backer laminated immediately under both the flexible cable and the leadless chip carrier.
Figure 7:
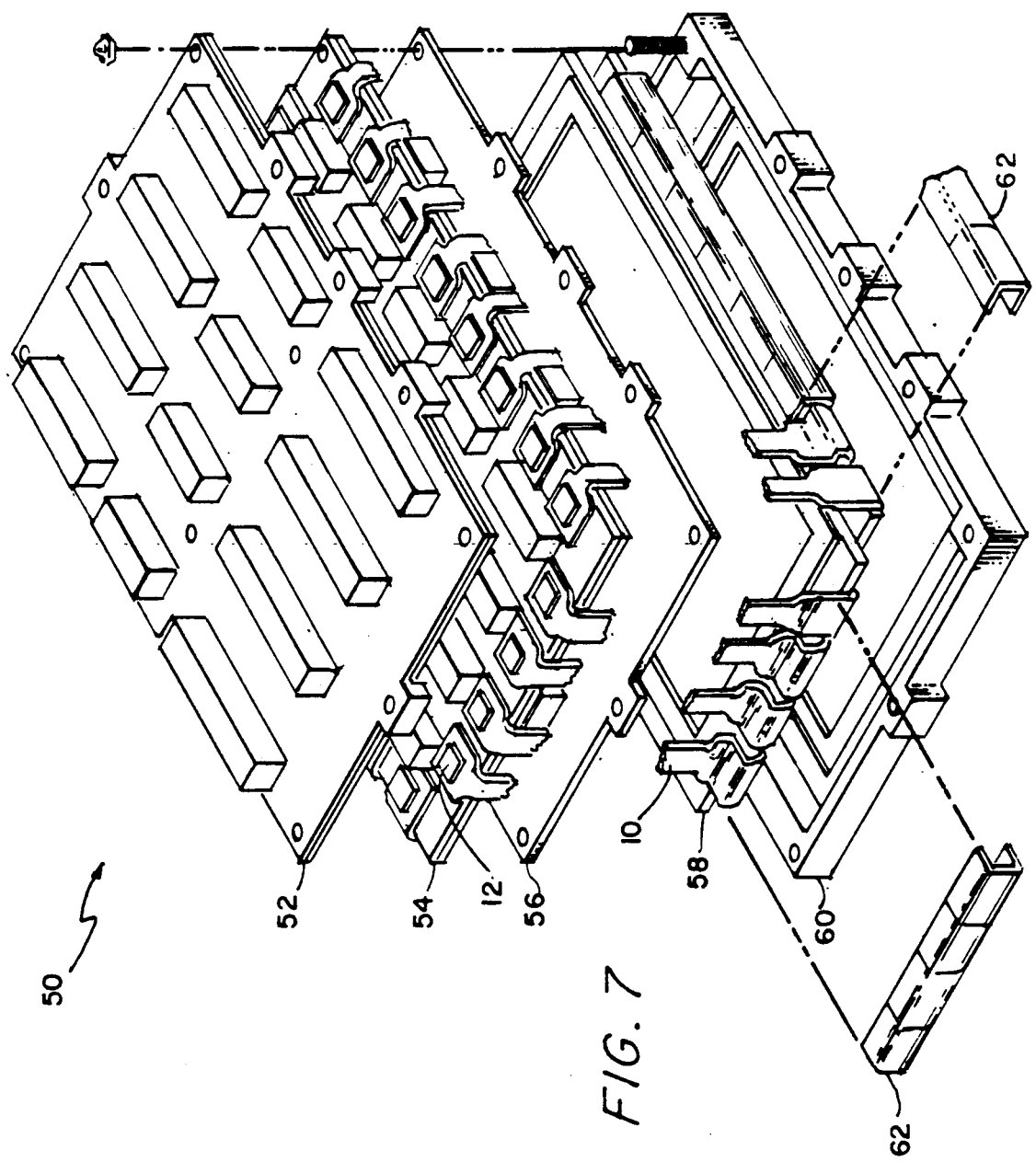
FIG. 7 is an exploded perspective of a matrix display assembly showing the flexible cable assembly interconnecting between a drive electronics board and a matrix display element.

Referring to FIGS. 1, 2 and 7 there is shown a flexible cable assembly 10 comprising a flexible cable 11 having formed therein layers of insulated strip conductors 24 and 32, a leadless chip carrier 12 attached to one end of the flexible cable 11, a heat sink/backer 14 attached to the flexible cable 11 under the area covered by the leadless chip carrier 12, and connection means including pins 15 and strip conductor end connector 16 on the ends of the flexible cable 11 for connecting between portions of a display assembly 50. The leadless chip carrier 12 provides the means for interconnecting one or more circuit chips or other devices within said carrier. Pins 15 provide the means for electrically connecting one end of the flexible cable assembly 10 to a printed wiring board. The other end connector 16 of the flexible cable assembly 10 is embodied by a one-quarter inch end portion of the strip conductor layer 32. End connector 16 does not have a coating of insulating material but instead has a conductive plating which enables this end of the assembly 10 to be clamped against mating conductors on a display element 58 of the display assembly 50 as shown in FIG. 7. The flexible cable assembly 10 is used in the display assembly 50 to interconnect a portion of a drive electronics module 54 to a portion of the display element 58. Pins 15 plug into the drive electronics module 54 and end connector 16 is wrapped around the edge of the display element 58 while its exposed strip conductor contacts are aligned with mating contacts on the bottom side (not shown) of display element 58. A clamp 62 secures end connector 16 to the mating contacts on the display element 58. Referring now to FIG. 2 a side view of the flexible cable assembly 10 shows the heat sink/backer 14 and the pins 15 for connecting to a printed wiring board.

Figure 3:
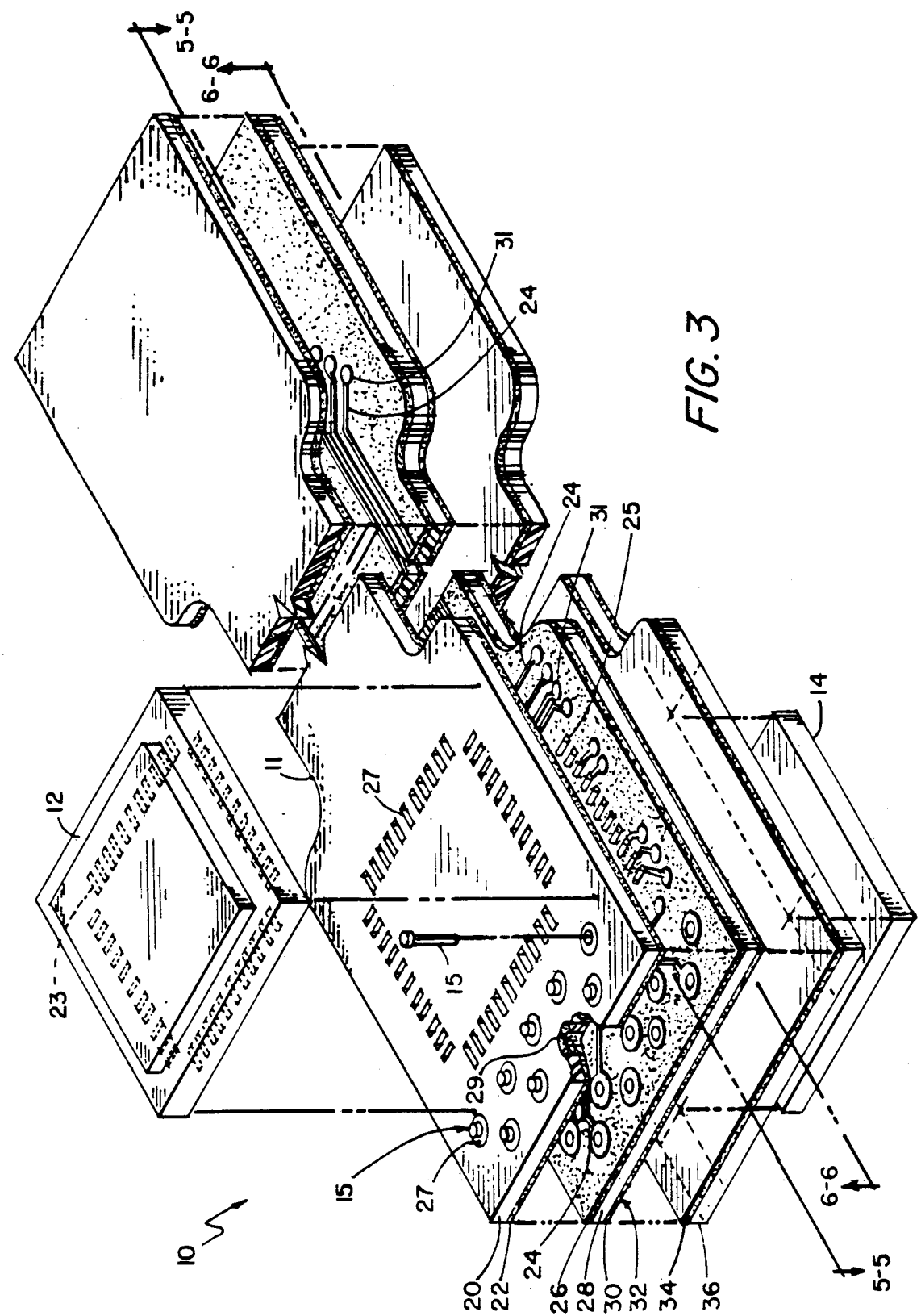
FIG. 3 is an exploded perspective view of the flexible cable assembly according to the invention.
Figure 4:
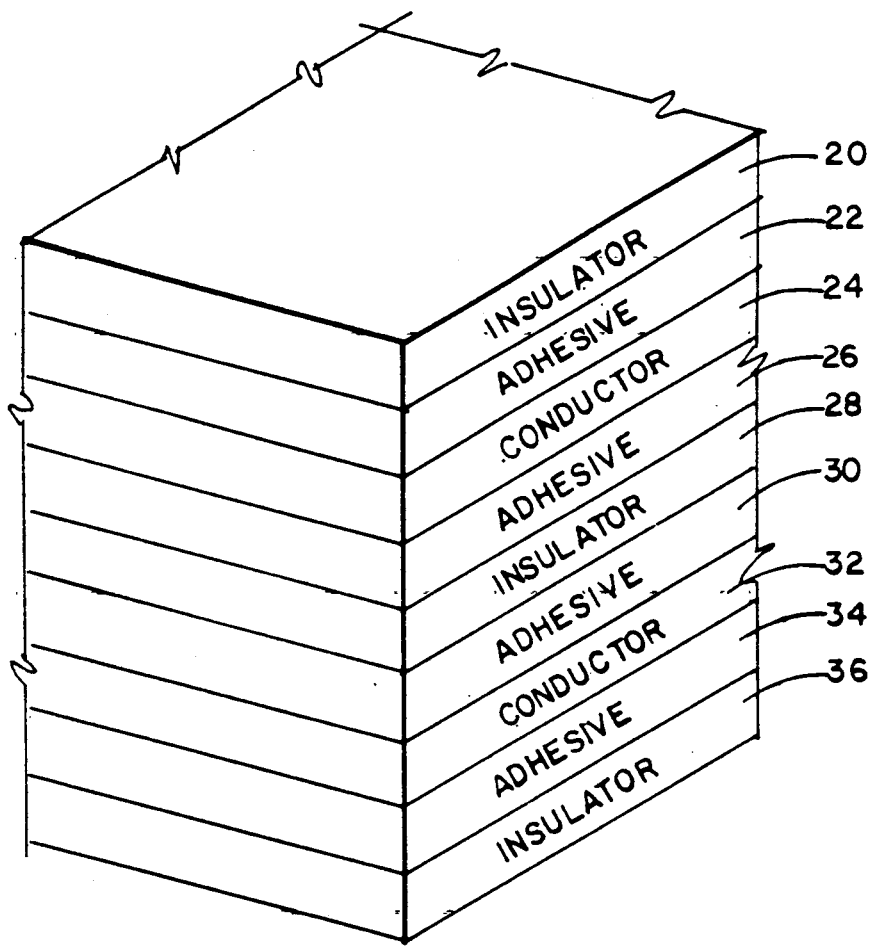
FIG. 4 identifies the material layers of the flexible cable shown in FIG. 3.

Referring now to FIG. 3 and FIG. 4, an exploded perspective view of the flexible cable assembly 10 is shown in FIG. 3 and in particular the flexible cable 11 comprising a plurality of layers of materials. It is noted that the vertical scale in FIG. 3 is distorted and the thicknesses of the material layers is greatly exaggerated. FIG. 4 conveniently identifies the layers of materials used to form the two conductive layer flexible cable 11. The base material in the flexible cable 11 forming insulating layers 20, 28, 36 is a condensate polyimide which may be embodied by a Kapton ® polyimide manufactured by E. I. duPont de Nemours & Co. Inc. of Fairfield, Conn. 06433. A Kapton ® polyimide is selected because of its flexibility, tensile strength and excellent insulating properties in thin sheets of 1 to 2 mils. The conductors 24 and 32 are formed from soft copper foil generally 1 or 2 ounce (1.4 or 2.8 mils), and it is rolled annealed thereby providing a relatively soft copper. Layers 22, 26, 30, 34 of an acrylic adhesive such as Paralux TM also manufactured by E. I. du Pont Nemours Co. Inc. are used to bond together the Kapton ® insulating layers 20, 28, 36 and the copper conductor layers 24, 32. Such an acrylic adhesive is used in thicknesses of 1 and 2 mils. Leadless chip carrier 12 which is a familiar device to those skilled in the art of microelectronics has leadless terminals 23 disposed around its perimeter, and it is soldered to specifically arranged corresponding pads 25 on the flexible cable 11. Apertures 27 are cut in the Kapton ® layer 20 to avoid insulating the tops of solder pads 25 which protrude through the mating apertures 27 and to enable pins 15 to be inserted into the flexible cable 11 and soldered. The heat sink/backer 14 may be embodied with an epoxy glass such as G10 material known to one skilled in the art or other alternate heat conductive material such as alumina or coefficient of expansion matched material such as a copper-invar-copper laminate depending on the cooling needs and thermal expansion characteristics of a particular LCC. The heat sink/backer 14 may be of a size as shown in FIG. 1 and 3 covering the area under the LCC 12 or it may be larger covering the area around the connection pins 15. It is attached to the flexible cable 11 by means of an adhesive. The heat sink/backer 14 provides a means to restrain the flexible cable assembly 10 to assure that the input connector pins 15 stay mated, that the LCC 12 is in proper contact with the heat sink/backer 14 and that the flexible cable 11 is restrained in the area of the LCC 12 in order to prevent fatiguing of the LCC 12 solder connections. Pins 15 are inserted, swagged and soldered into each one of the nine plated-thru holes 29 of a first end of flexible cable assembly 10 and these pins 15 form the connecting means for attaching the first end of the cable assembly 10 to a printed circuit board. A second end of flexible cable assembly 10 comprising connector 16 is clearly shown in the cut-away section of FIG. 1. Approximately one-quarter inch of the bottom ends of the plurality of copper strip conductors of layer 32 are noninsulated as noted hereinbefore and gold-plated, thereby permitting these conductors to be used as an end connector 16 for clamping this end of cable assembly 10 to mating conductors on the display element 58 by a U-shaped clamp 62 as shown in FIG. 7.

The method for making a flexible cable 11 is similar to the method for making single, double sided and multilayer printed wiring boards and known to one skilled in the art because both methods include etched copper on a dielectric material. Printed wiring boards are generally used to interconnect components whereas flexible cables are generally used to interconnect printed wiring boards to other printed wiring boards or other active devices. Because they are so similar, most of the method steps are the same even though some of the material may be different. The method of fabricating a flexible cable 11 comprises the following steps:

1. Select material, thickness and assemble: insulator (Kapton ®), adhesive (Paralux TM), conductor (soft copper).

2. Punch or drill tooling holes: Holes shall match the artwork and drill tape for back-to-front registration and cover sheet lamination.

3. Drill thru-holes: Special attention must be given to drill feeds and speeds because of the burring of the soft copper.

4. Desmear excess adhesive: Smear is caused by the drill heating up going through the copper, melting the acrylic, and smearing acrylic on the copper during the exit stroke of the drill.

5. Electroless and electroplate copper for plated thru-holes: Only used when plated thru-holes are present on the circuit and is the same process used for printed wiring boards.

6. Image Conductor Pattern: The flexible cable now has copper on two sides with plated thruholes. It is then coated with dry film photo resist, the artwork aligned, exposed and developed leaving a positive image of the desired circuit with photo resist tenting the thru-holes for protection during subsequent processing.

7. Etch Conductor Pattern: Standard as for printed wiring board fabrication; etching chemically removes the excess copper leaving the desired circuit.

8. Clean: Cleanliness is the single most important process in successfully producing printed wiring boards, multilayer boards (MLB), or flexible cables. A cleaning step or several cleaning steps take place before each operation to insure that subsequent process steps can be performed without interference from undesired dirt, oxide, or residues.

9. Cover Coat: To protect the copper conductors from handling damage and electrical shorting, a coating over the conductors is necessary. To maintain the flexibility, the same base materials are used for the cover coating. A thin Kapton TM layer is laminated over the conductors using the proper amount of acrylic adhesive. In this case, the adhesive is predrilled or punched to leave pads exposed for soldering.

10. Laminate heat sink/backer: Acrylic adhesive is used to adhesively attach the heat sink/backer to the flexible cable.

11. Solder Coat: Since there is no need for solder anywhere but on the pads, flexible cables are solder coated after the cover coat is laminated. This is done by dipping the part in molten solder and removing the excess solder by blowing with hot air or hot oil or wiping with a roller to remove the excess solder.

12. Profile: Routing with templates and carbide tools is generally used for printed wiring boards and multi-layer boards but tends to be expensive. However, flexible cables can be cut very effectively using inexpensive steel rule dies, or in small quantities can be knife cut.

Figure 5:
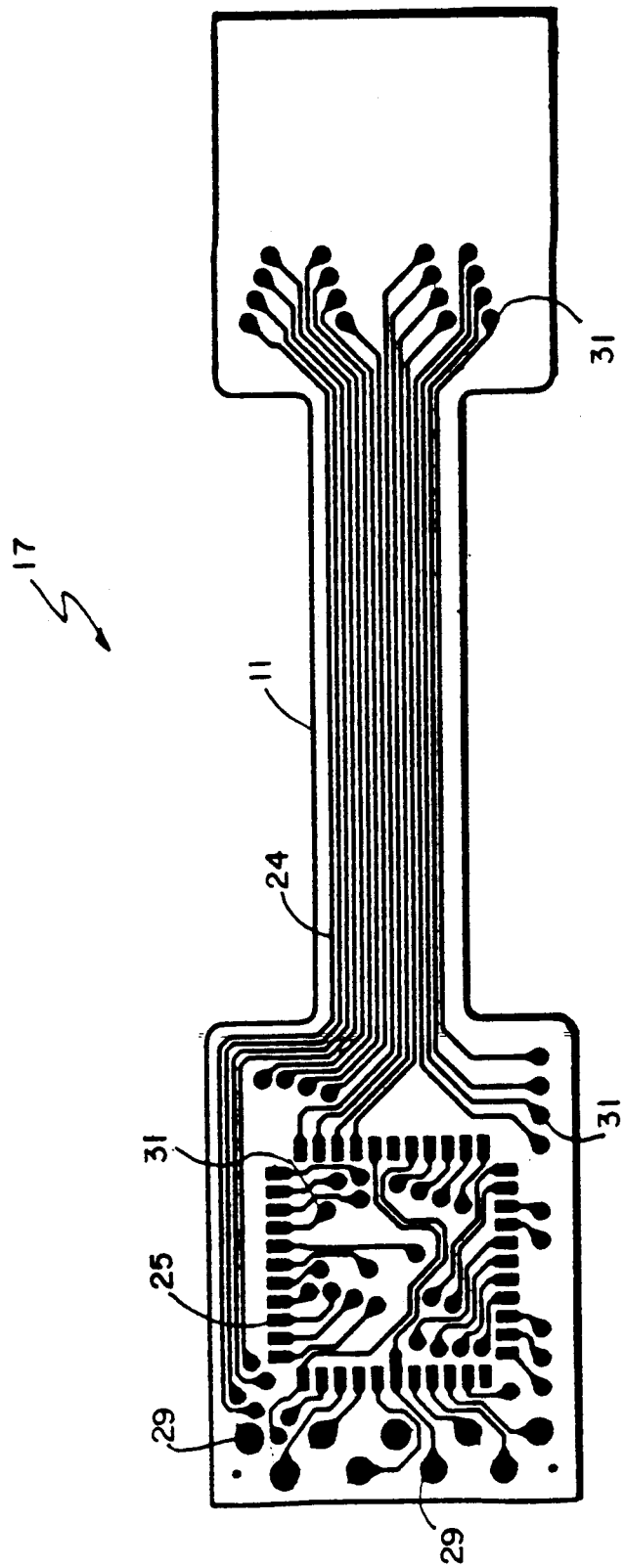
FIG. 5 is a layout of a top layer of copper strip conductors according to the invention.
Figure 6:
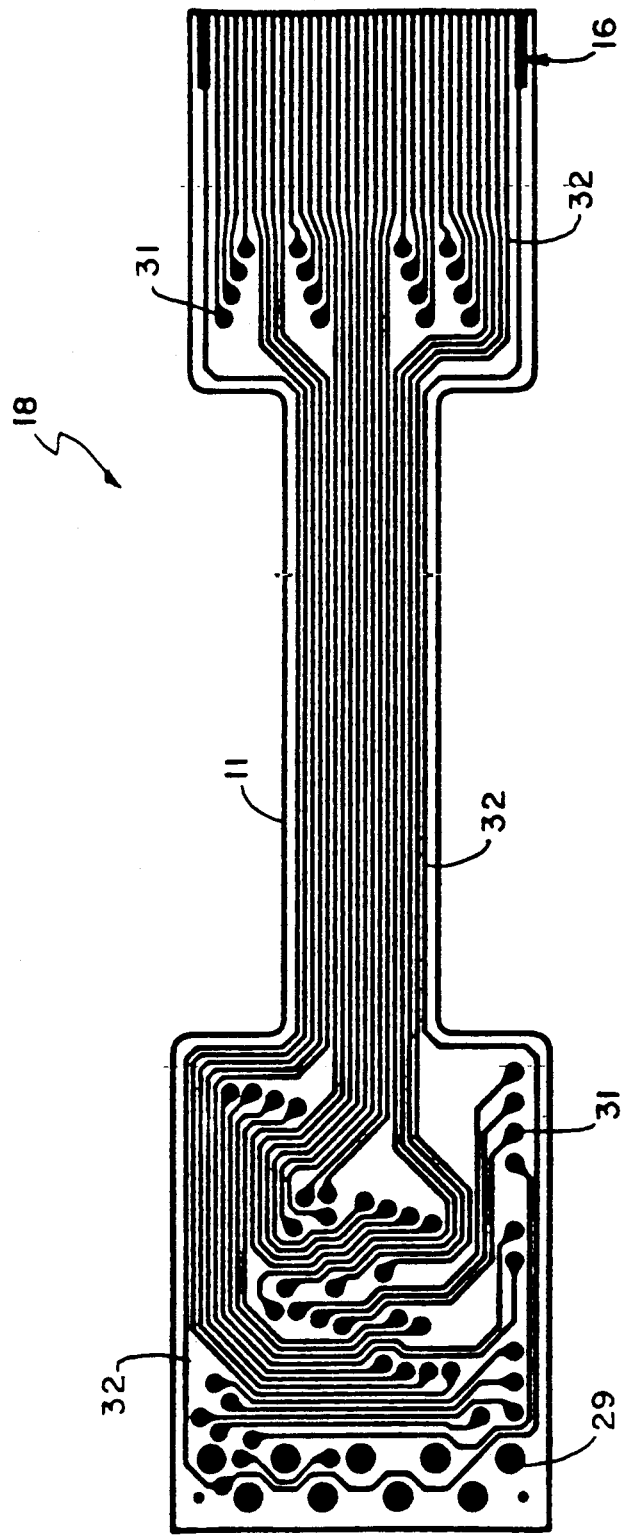
FIG. 6 is a layout of a bottom layer of copper strip conductors according to the invention.

Referring now to FIGS. 3, 5 and 6, typical layouts for the top and bottom layers of copper conductors 24 and 32 of flexible cable 11 on the Kapton ® dielectric material layer 28. are shown after the etching step of the fabrication method. Also shown in FIG. 5 are the circular dots which will become plated thru-holes 29, 31 and the copper pad arrangement 25 for attach the leadless chip carrier 12 to the flexible cable 11.

Referring again to FIGS. 1, 2 and 3, when the flexible cable 11 is made the steps for completing the assembly of the flexible cable assembly 10 are as follows:

1. First Inspection: The flexible cable 11 is inspected for workmanship and conformance to specifications.

2. Solder Paste Application: Solder paste is screen printed onto the solder pads 25 utilizing common screening equipment.

3. Placement of LCC: A leadless chip carrier 12 having pre-tinned pads 23 is placed with proper orientation on the arranged solder pads 25 on the flexible cable 11.

4. Second inspection: The placement of the LCC 12 onto the flexible cable 11 is inspected to assure that the pre-tinned pads 23 on the LCC 12 are aligned properly to the solder pads 25 on the flexible cable 11.

5. Vapor phase soldering: The flexible cable 11 with the LCC 12 attached is vapor phase reflow soldered.

6. Third inspection: The soldered assembly 10 is inspected for proper solder joints (fillets).

7. Cleaning: A cleaning is performed to remove solder flux and other contaminates.

8. Connector pin attachment: The terminal pins 15 are swagged into each of the 9 plated-thru holes 29 and soldered into position.

9. Fourth Cleaning: A cleaning is performed to remove flux residues resulting from the previous soldering.

10. Final Inspection: A final inspection of the flexible cable assembly is performed to verify proper workmanship and compliance with assembly procedures.

Referring now to FIG. 7 the flexible cable assembly 10 is shown interconnecting two portions of a flat panel matrix display assembly 50 which is shown in an exploded perspective view. The first end of the flexible cable assembly 10 having the pins 15 adjacent to the leadless chip carrier 12, is inserted into a driver electronics module 54, and the second end connector 16 of the flexible cable assembly 10 having exposed strip conductors on one side of the flexible cable 11 is wrapped around the edge of a flat glass panel matrix display element 58 while simultaneously aligning the exposed conductors of end connector 16 to the mating conductors on the edge of the bottom side (not shown) of the display element 58. End connector 16 is secured to the display element 58 by a U-shaped clamp 62. A plurality of flexible cable assemblies 10 comprising chip carriers having high voltage driver circuits are used in such a flat panel matrix display assembly 50 around the perimeter of the driver module 54 and display element 58 to make all the necessary interconnections for displaying and selecting one or more of a plurality of characters on such display element 58. The matrix display assembly 50 also comprises a controller module 52 for controlling signals to the driver module 54 and hence the display element 58, a stiffener panel 56 and a frame/bezel 60 for protecting and supporting the integrity of the display element 58. The display element 58 may be embodied by a flat panel plasma display element, part No. PDM256512-062, manufactured by Electro-Plasma Inc. (EPI) of Milbury, Ohio. The input signals to the LCC 12 on the flexible cable assembly 10 from the driver module 54 are all via the connector means formed by pins 15. The output signals from the LCC 12 to the display element 58 are via the flexible cable end connector 16 having the exposed or noninsulated strip conductors which are aligned with the mating conductors on the peripheral edge of the display element 58 and clamped in place. The number of connector pins 15 needed for connection between flexible cable assembly 10 and the driver module 54 is significantly less than what would be required without the placement of the active LCC 12 device on the cable assembly 10. Only a small number of pins are required to handle control drive signal inputs to the flexible cable assembly 10 and the larger group of decoded output signals from the LCC 12 are handled by the layers of strip conductors 24, 32 and the noninsulated end connector 16 formed from layer 32. The use of a flexible cable assembly 10 in the matrix display assembly 50 not only reduces the number of direct electrical connections required between the driver module 54 and the display element 58, but also significantly decreases the overall volume of the matrix display assembly 50. In addition, maintainability of the matrix display assembly 50 is improved by allowing the driver module 54, the display element 58 and the flexible cable assembly 10 to be disassembled and reassembled in the field. Repairs can now be readily performed in the field on the driver module 58 and the flexible cable assembly 10 by the replacement of failed circuit parts or devices with relatively inexpensive spare circuit parts or devices.

This concludes the description of the preferred embodiment. However, many modifications and alterations would be obvious to one of ordinary skill in the art without departing from the spirit and the scope of the inventive concept. For example the flexible cable may have one conductor layer or multiple conductor layers, the material in the conductive layers as well as the plating on the connecting end to the matrix display may be copper, gold, silver, aluminum or other similar electrically conductive material or material compound. The surface area of the heat sink may be smaller or larger or the type of connecting means on each end of the flexible cable assembly may vary depending on the particular applications. Therefore, it is intended that the scope of this invention be limited only by the appended claims.

What is claimed is:

1. A display assembly comprising:

display element means for displaying a plurality of characters;

a plurality of chip carrier means having driver circuit means for selecting one or more of said plurality of characters;

a plurality of flexible cables having formed therein a plurality of insulated strip conductors, said flexible cables being readily connected and disconnected within said display assembly;

prearranged solder pad means disposed on a portion of a first side of each one of said flexible cables for attaching one of said plurality of chip carrier means, a portion of said solder pad means being coupled to a portion of said strip conductors;

means, disposed on a portion of a second side of each one of said flexible cables under said chip carrier means and attached to said flexible cables, having a coefficient of expansion approximately matched to a coefficient of expansion of said chip carrier means, for restraining said flexible cables during temperature variations to accommodate said chip carrier means expansion, said disposed means providing support to each one of said flexible cables, further restraining said flexible cables to prevent fatiguing at said solder pad means of said chip carrier means and removing heat from said chip carrier means; and means on a first end and second end of each one of said flexible cables and coupled to portions of said strip conductors for attaching said first end within said display assembly and said second end to said display element, said attaching means facilitating disconnection of each one of said flexible cables for repair.

2. The display assembly according to claim 1, wherein: said display element comprises a matrix display element.

3. The display assembly according to claim 1, wherein:

said conductors in said flexible cable comprise a first layer and a second layer with a layer of flexible insulating means on each side of said first layer and said second layer; and a layer of adhesive means between said layer of said conductors and each layer of said flexible insulating means.

4. The display assembly according to claim 3 wherein:

said flexible insulating means comprises a condensate polyimide.

5. The display assembly according to claim 1 wherein:

said first end of each one of said flexible cables immediately adjacent to said chip carrier comprises a plurality of pins for connecting said first end within said display assembly in a manner to facilitate said disconnection for repair and said second end of each one of said flexible cables comprises a noninsulated conductive-plated portion of said strip conductors for attaching said noninsulated conductors to mating conductors on said display element with a clamp means to facilitate said disconnection for repair.

6. The display assembly according to claim 1 wherein:

said disposed means comprises a laminate material backing means for damping thermal related forces received at a surface of said backing means.

* * * * *